(12) United States Patent
Madore

(10) Patent No.: US 6,903,551 B2
(45) Date of Patent: Jun. 7, 2005

(54) VARIABLE-DENSITY PARALLEL MAGNETIC RESONANCE IMAGING

(75) Inventor: Bruno Madore, Brookline, MA (US)

(73) Assignee: Brigham & Women's Hospital, Inc., Boston, MA (US)

( * ) Notice: Subject to any disclaimer, the term of this patent is extended or adjusted under 35 U.S.C. 154(b) by 0 days.

(21) Appl. No.: 10/427,400

(22) Filed: May 1, 2003

(65) Prior Publication Data

US 2003/0206016 A1 Nov. 6, 2003

Related U.S. Application Data

(60) Provisional application No. 60/376,739, filed on May 1, 2002.

(51) Int. Cl.[7] ................................................ G01V 3/00
(52) U.S. Cl. ....................................... 324/309; 324/307
(58) Field of Search ............................... 324/309, 307, 324/306, 312, 314, 300

(56) References Cited

U.S. PATENT DOCUMENTS

| | | | |
|---|---|---|---|
| 5,119,026 A * | 6/1992 | Iino et al. ................. | 324/309 |
| 5,881,728 A * | 3/1999 | Mistretta et al. ........... | 600/420 |
| 6,556,009 B2 * | 4/2003 | Kellman et al. ........... | 324/307 |
| 2002/0111549 A1 | 8/2002 | Wang ........................ | 600/407 |

FOREIGN PATENT DOCUMENTS

| WO | WO 01/41639 A1 | 6/2001 |
|---|---|---|
| WO | WO 02/10790 A1 | 2/2002 |

OTHER PUBLICATIONS

International Search Report mailed Aug. 18, 2003.
McKenzie C.A., et al, "Self–Calibrating Parallel Imaging with Automatic Coil Sensitivity Extraction", Magnetic Resonance in Medicine, Academic Press, Deluth, MN, US, vol. 47, No. 3, Mar. 2002, pp. 529–538.

Madore B., "Unfold–Sense: A Self–Calibrated Parallel–Imaging Method with Artifact Suppression", Proc. Intl. Soc. Mag. Reson. Med. 10th Annual Meeting, May 18–24, 2002, Honolulu, Hawaii.

* cited by examiner

Primary Examiner—Louis Arana
(74) Attorney, Agent, or Firm—Ivor R. Elrifi, Esq.; Mintz, Levin, Cohn, Ferris, Glovsky & Popeo, P.C.; Shane H. Hunter, Esq.

(57) ABSTRACT

A variable density non-Cartesian parallel-imaging method for reconstructing a magnetic resonance (MR) image is provided. In embodiments of the invention, an MR data set is obtained by sampling first and second sampling regions, wherein a first region is sampled with a first sampling density that is higher than a second sampling density of a second region. MR images corrupted by aliasing artifacts are reconstructed from the data obtained with each one of the coil-elements of a coil array. These images can be combined into one, de-aliased image using a modified version of Cartesian SENSE. The modification allows all the available k-space lines to be used in the processing, despite the fact that different k-space regions have different sampling densities (i.e. non-Cartesian sampling). Using all available lines is advantageous in terms of signal-to-noise ratio. Advantages of embodiments of the invention over previous methods also able to deal with non-Cartesian sampling schemes may include one or more of simplicity, ease of implementation, not having to fit sensitivities to target functions as part of the reconstruction, fast processing speed and/or the avoidance of possible errors resulting from solving large systems of equations.

26 Claims, 3 Drawing Sheets

VARIABLE-DENSITY PARALLEL MAGNETIC RESONANCE IMAGING

CROSS-REFERENCE TO RELATED APPLICATIONS

This application claims the benefit of U.S. Provisional Application No. 60/376,739 filed May 1, 2002.

FIELD OF THE INVENTION

The invention relates generally to reconstruction methods for magnetic resonance image (MRI) data and more specifically to reconstruction methods for MRI data acquired using non-Cartesian sampling and parallel imaging.

BACKGROUND OF THE INVENTION

In many magnetic resonance imaging (MRI) applications, a given region of the body is imaged repeatedly to capture its time variations. For example, such dynamic applications include functional MRI (in which brain changes are induced by a time-varying paradigm), time-resolved angiography (in which changes in the blood vessels are caused by the passage of a bolus of contrast agent), and cardiac imaging (in which the heart changes as it beats, and also possibly as a bolus of contrast agent passes through it). The temporal resolution of the MRI, i.e. the time to acquire a time frame, should be good enough to capture the important features of the temporal changes. In the event that the readily available temporal resolution proves insufficient, there exist many dynamic MRI methods able to improve it. Some of these methods include UNFOLD, parallel imaging (e.g. SMASH, SENSE, SPACE-RIP) and partial-Fourier imaging techniques. Through some assumption(s) and/or the use of prior information, these methods allow a fraction of the required data to be calculated instead of measured. This reduction in the amount of acquired data usually translates directly into a corresponding reduction in the time to acquire the data and thus can improve the temporal resolution, and/or the total scan time.

Possibly due to its simplicity and fast processing speed, Cartesian SENSE may be the most commonly used parallel imaging method. Cartesian SENSE is typically limited to Cartesian, regular sampling schemes. More general methods such as SPACERIP or general SENSE can be used to reconstruct data acquired along more complicated trajectories in k-space. Recently, non-Cartesian sampling schemes such as variable-density SMASH, GRAPPA and others have allowed sensitivity information to be obtained as part of the dynamic acquisition by sampling more densely the center of k-space than the outer regions. These "self-calibrated" methods do not require the acquisition of a reference scan to measure the coil sensitivity; instead, coil sensitivity is preferably calculated directly from the fully sampled region around the center of k-space, in the dynamically acquired data set.

A regular Cartesian sampling scheme 10 is shown in FIG. 1A in which only one k-space line 12 out of every four is sampled. FIG. 1B shows the resulting image 20 from one of the coils. The image 20 is corrupted by aliasing artifacts resulting from sampling only 24 k-space lines rather than 96. As described in the publication SENSE: sensitivity encoding for fast MRI, 42 MAGN RESON MED 952 (1999) by Klaas P. Pruessmann et al., Cartesian SENSE can be used to separate the four overlapped spatial locations at each image pixel to reconstruct a full, de-aliased image. FIG. 1C shows an image 30 that was reconstructed and de-aliased using Cartesian SENSE.

FIG. 2A shows another sampling technique 40 that is similar to the technique 10 used in FIG. 1A with the exception that all of the missing k-space locations 42 are filled with zeros before applying a Fourier transform (FT). As a consequence of the presence of the zeros, a full field of view (FOV) is reconstructed in the image 50 shown in FIG. 2B instead of the smaller, acquired FOV of the image 20 in FIG. 1B.

In an alternative method, the four overlapped spatial locations at each pixel of the image 50 in FIG. 2B could be separated by keeping only the non-aliased pixel and discarding the remaining three aliased pixels. This method and the method described above for FIG. 1B are mathematically equivalent, and lead to numerically identical treated images 30 and 60 as shown in FIGS. 1C and 2C.

Typically, it is desirable to use a Cartesian sampling function because of the simplicity of calculations associated with the data reconstruction. Other known non-cartesian sampling methods, such as SPACERIP and the general version of SENSE allow data acquired with a non-Cartesian sampling scheme to be reconstructed into images, but require a significantly larger number of calculations to do so. While variable-density SMASH and GRAPPA do allow the use of a sampling strategy that departs from a Cartesian grid, these methods make the approximation that coil sensitivities can be combined to emulate functions that are related to Fourier basis functions, an approximation absent in the SENSE/SPACERIP approach.

SUMMARY OF THE INVENTION

A variable density, non-Cartesian method for reconstructing a magnetic resonance (MR) image is provided. In an embodiment of the invention, an MR data set is obtained by sampling first and second sampling regions using parallel imaging, wherein a first region is sampled with a first sampling density that is higher than a second sampling density of a second region. The MR data set can be reconstructed using a modified method of Cartesian SENSE that includes reconstructing both the first and the second sampling regions using an acceleration rate of the second region.

In embodiments of the invention, a method of magnetic resonance (MR) imaging for reconstructing an MR image is provided, wherein the method generally includes: acquiring an MR data set by using a phased-array coil consisting of a plurality of individual coil-elements and by sampling first and second sampling regions, wherein the first region is sampled with a higher sampling density than the second region; reconstructing a plurality of images from a plurality of individual coil-elements; and combining the plurality of images from the individual coil-elements into a resultant MR image by using parallel-imaging reconstruction.

In embodiments of the invention, the sampling density is higher near k-space center than elsewhere, and the data is reconstructed using a variable-density version of Cartesian SENSE.

Embodiments of the invention reconstruct MR images using a number of calculations almost as low as that of Cartesian SENSE, while allowing k-space sampling schemes that depart from purely Cartesian grids.

Various embodiments of the invention may provide one or more of the following advantages. Advantages of embodiments of the invention over previous methods also able to deal with non-Cartesian sampling schemes may include one or more of: simplicity in data reconstruction, ease of implementation (similar to Cartesian SENSE), not having to fit sensitivities to target functions as part of the reconstruction, fast processing speed and the avoidance of possible errors resulting from solving large systems of equations. Advantages of the invention may include a faster processing speed than non-Cartesian methods such as SPACERIP and general SENSE, and the absence of the need for fitting sensitivity maps to target functions as in variable-density SMASH and GRAPPA. Non-Cartesian sampling can be used and images reconstructed without using large numbers of calculations.

BRIEF DESCRIPTION OF THE FIGURES

FIGS. 1B and 1C are MR images corresponding to the data acquired in FIG. 1A, wherein FIG. 1B is an image from one of a plurality of individual coil-elements of a phased-array coil, and FIG. 1C is the resultant image after Cartesian SENSE processing.

FIGS. 2B and 2C are MR images corresponding to the data acquired in FIG. 2A, wherein FIG. 2B is an image from one of a plurality of individual coil-elements of a phased-array coil and FIG. 2C is the resultant image after Cartesian SENSE processing.

FIGS. 3B and 3C are MR images corresponding to the data acquired in FIG. 3A, wherein FIG. 3B is an image from one of a plurality of individual coil-elements of a phased-array coil and FIG. 3C is the result image from an embodiment of the invention.

DETAILED DESCRIPTION OF THE INVENTION

Embodiments of the invention provide a method for modifying the MR reconstruction technique of Cartesian SENSE such that it can accommodate a sampling strategy that departs from a purely rectangular grid and allows for MR data reconstruction with a relatively low number of calculations. Near-Cartesian data sampling can be performed in conjunction with parallel processing of acquired data. The near-Cartesian sampling departs from pure Cartesian sampling, although more general methods such as SPACERIP and GRAPPA can handle more drastic departures from Cartesian sampling. Data are more densely sampled near a center of k-space than away from the k-space center, and receiver-coil sensitivity is measured "on the fly" during data acquisition to provide a self-calibrating system.

Figure 3A:
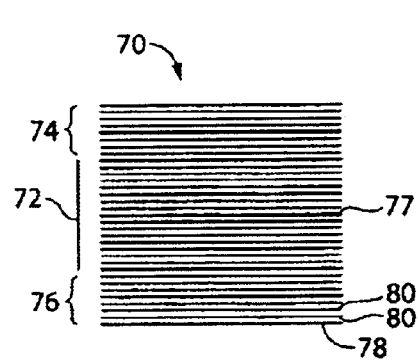
FIG. 3A is a diagram of a sampling scheme according to the invention.

For purpose of illustration, the invention will now be described with reference to FIGS. 3A–3C, in which a method for reconstructing MR image data is shown. FIG. 3A shows an exemplary sampling method 70 in which a first region 72 of k-space is sampled at a higher density than the remaining sampled regions 74 and 76. Region 72, which includes the center of k-space, is sampled at an acceleration rate of 2 such that one out of every two k-space lines 77 is sampled. Regions 74 and 76, which are at the upper and lower outer edge regions of k-space, respectively, are sampled at an acceleration rate of 4 such that one out of every four k-space lines 78 is sampled.

Figure 1C:
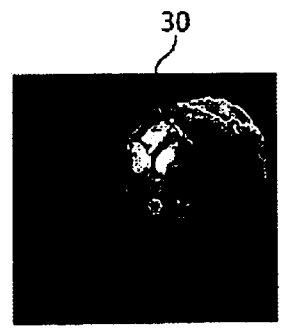
Figure 2A:
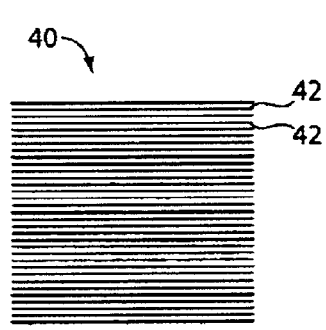
FIG. 2A is a diagram of a prior art Cartesian SENSE sampling scheme similar to the sampling scheme of FIG. 1A but with zeros filled in missing k-space locations.
Figure 2B:
Figure 2C:
Figure 3B:
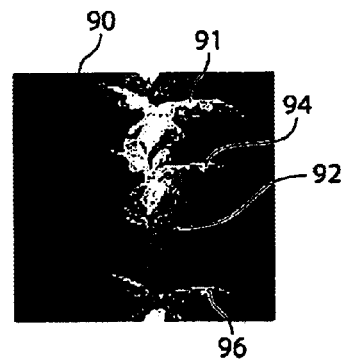
Figure 3C:

The image shown in FIG. 3B, which has desired information 91 and aliasing artifacts 92, 94 and 96, is obtained by correcting for sampling density and Fourier transforming the data obtained from one of the individual coil-elements forming the phased-array coil while using the sampling strategy of FIG. 3A. In FIG. 3B, aliasing artifacts 92, 94 and 96 are satisfactory for use with embodiments of the invention as they look fairly sharp and are not diffused or smeared over the image. Such non-smeared artifacts can be expected if the non-Cartesian sampling strategy mildly departs from a purely Cartesian strategy (as is the case in FIG. 3A). To obtain the reconstructed image 100 shown in FIG. 3C, the method of Cartesian SENSE modified according to the invention is applied to remove the aliasing artifacts 92, 94 and 96. That embodiments of the invention can remove the aliasing artifacts 92, 94 and 96 similar to FIGS. 1C and 2C indicates that the invention can be used to modify Cartesian SENSE to handle small departures from regular, Cartesian sampling. For example, the invention can be used to increase the sampling density near k-space center, as proposed in other methods for self-navigated parallel imaging.

As part of the invention, a region of k-space is sampled to obtain data at a higher k-space sampling density and a lower acceleration rate than another region and the sampled data is reconstructed using a modified version of Cartesian SENSE. For example, a method of the invention could include sampling at a higher density near a k-space center than elsewhere, allowing self-calibration and/or a reduction in artifact content. Alternatively, it may be more desirable to sample a region other than the center of k-space at a higher sampling rate. The invention allows all of the lines acquired in FIG. 3A (i.e. a non-Cartesian set) to contribute to the reconstruction, which is desirable in terms of signal-to-noise-ratio (SNR). One could dismiss lines in FIG. 3A to obtain a Cartesian pattern, and reconstruct the resulting Cartesian data set with Cartesian SENSE. However, dismissing lines comes at a cost in SNR, which can be avoided with the invention. In the reconstruction, the acceleration of the least densely sampled region, i.e. the highest acceleration of all the sampled k-space regions, is used in the parallel imaging algorithm.

Typically, as part of the method of reconstructing the MR data, a system of linear equations will be solved during which two steps will be performed. These steps 1) invert a matrix, and 2) multiply the inverted matrix by a particular vector. Step 1 uses most of the processing time and step 2 is performed much quicker. Step 1 is represented in the above-mentioned article by Pruessmann et al. by approximating the inverse of a sensitivity matrix S given by:

$$S_{\gamma,\rho} = s_\gamma(r_\rho)$$

where $\gamma, \rho$ counts coils (see FIG. 4 and description below) and the superimposed pixels, respectively, $r_\rho$ denotes the position of the pixel $\rho$, and $s_\gamma$ is the spatial sensitivity of the coil $\gamma$. The inverse of S is an unfolding matrix U given by:

$$U = (S^H \Psi^{-1} S)^{-1} S^H \Psi^{-1}$$

where the superscript H indicates the transposed complex conjugate, and $\Psi$ is a receiver noise matrix. In the second step, the unfolding matrix U is multiplied by a vector a, that represents the complex image values of a chosen pixel, to obtain a resulting vector v given by:

$$v = Ua.$$

For step 1, an exemplary embodiment of the invention reconstructs the data using the higher acceleration factor of two regions of k-space having different acceleration factors. Suppose, for example, an image is generated which consists of N pixels, in which a phased-array coil made of a collection of M different individual coils is used, and that parallel imaging is used to speed up data acquisition by a factor of n. The method of Cartesian SENSE uses the inversion of N/n matrices with each matrix having up to n*M elements. Embodiments of the invention slightly differ from Cartesian SENSE in that the higher acceleration factor ($n_h$) of the two regions is used for calculating the number of matrices ($N/n_h$) and the number of elements of each matrix (up to $n_h$*M). The total acceleration factor n, which takes the whole sampling scheme into account (and not just the region sampled with acceleration $n_h$), is smaller than $n_h$.

In step 2, an exemplary embodiment of the invention multiplies the inverted matrices "$n_h$" more times than is done in Cartesian SENSE (N multiplications rather than $N/n_h$, i.e. one multiplication per pixel in the reconstructed field-of-view rather than one multiplication per pixel in the smaller, acquired FOV as required in Cartesian SENSE). Because this step 2 tends to be much faster than step 1, embodiments of the invention thus use marginally more processing than Cartesian SENSE, and very significantly less than other variable-density methods such as SPACERIP and general SENSE (as those use the inversion of much larger matrices than in Cartesian SENSE and in the invention).

Figure 1A:
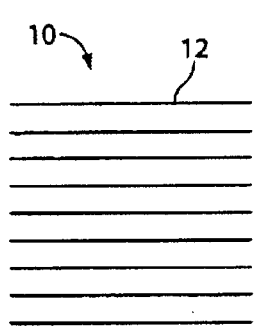
FIG. 1A is a diagram of a prior art Cartesian SENSE sampling scheme having acceleration rate of four.
Figure 1B:

Embodiments of the invention are used to handle only relatively small departures from a Cartesian, regular sampling. In exemplary preferred embodiments, a regular Cartesian sampling grid in k-space, e.g., the technique 10 shown in FIG. 1A, is perturbed using another regular or substantially regular pattern. Preferably, the sampling in k-space is not modified by a random insertion of k-space lines. For example, the sampling scheme depicted in FIG. 3A consists of two interleaved Cartesian sampling schemes: one line every four over all of k-space, and one line every four over the center of k-space and shifted by one line with respect to the former. Non-regular sampling schemes might lead to smeared artifacts, for which SPACERIP or general SENSE could be used. Using the invention, the near-Cartesian sampling will produce well-localized replica of the object which can be removed. In exemplary embodiments of the invention, missing k-space locations 80 from the sampling method 70 shown in FIG. 3A are filled with zeros and corrected for sampling density. With these embodiments a conventional Fast-Fourier transform algorithm may be used to generate the images from individual coil-elements.

Figure 4:
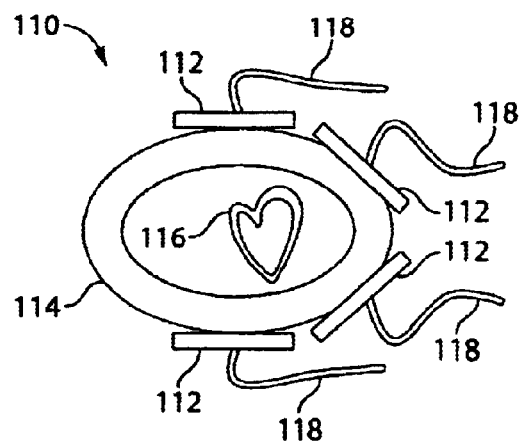
FIG. 4 is a simplified diagram of a phased array of coils for MR imaging an object.

Referring to FIG. 4, an arrangement for MR imaging includes an array 110 of coils 112. The coils 112 are configured to acquire data of an object 114, here a person's torso including a heart 116. Measurements obtained by the coils 112 are relayed through cables 118 to appropriate processing devices.

Figure 5:
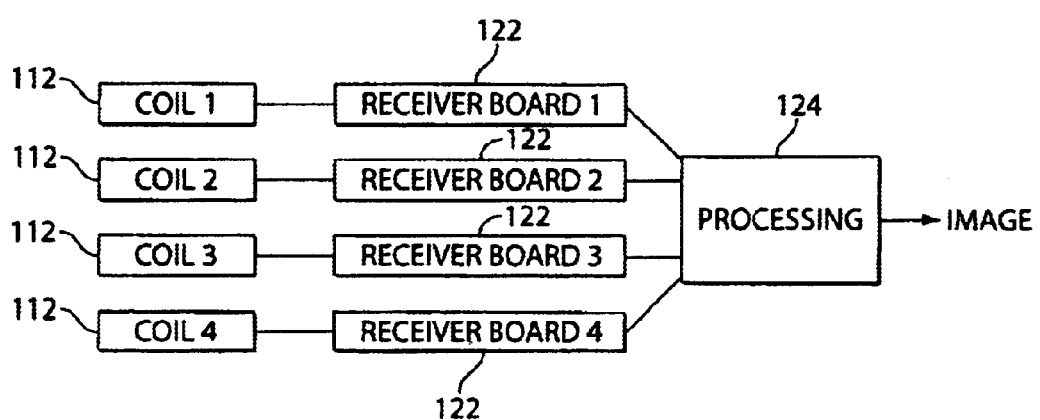
FIG. 5 is a simplified schematic diagram of a system for imaging an object in accordance with the invention.

Referring to FIG. 5, an imaging system 120 includes the coils 112, receiver boards 122, and a processor 124. An MR scanner can be used to generate MR images for the invention. One such MR scanner is manufactured by General Electric under the brand name Signa. The MR scanner can include the phased array 110 of coils having a plurality of different coil-elements, or the phased array 110 of coils can be separate from the MR scanner. The receiver boards 122 receive the measured data from the coils 112 and transmit these data to the processor 124. The processor 124, such as that found in a standard computer or a laptop, can be used to combine generated MR images. Alternatively, the processor 124 can be included as part of the MR scanner.

Methods of the invention can be performed with a computer and computer software installed thereon that has instructions to perform steps of the invention. Alternatively, methods of the invention can be performed with equipment that has installed hardware or firmware having instructions to perform steps of the invention. Software used with embodiments of the invention can be stored on computer usable media for storing data, such as, for example, but not limited to, floppy disks, magnetic tape, zip disks, hard drives, CD-ROM, ROM, optical disks, or a combination of any of these.

Figure 6:
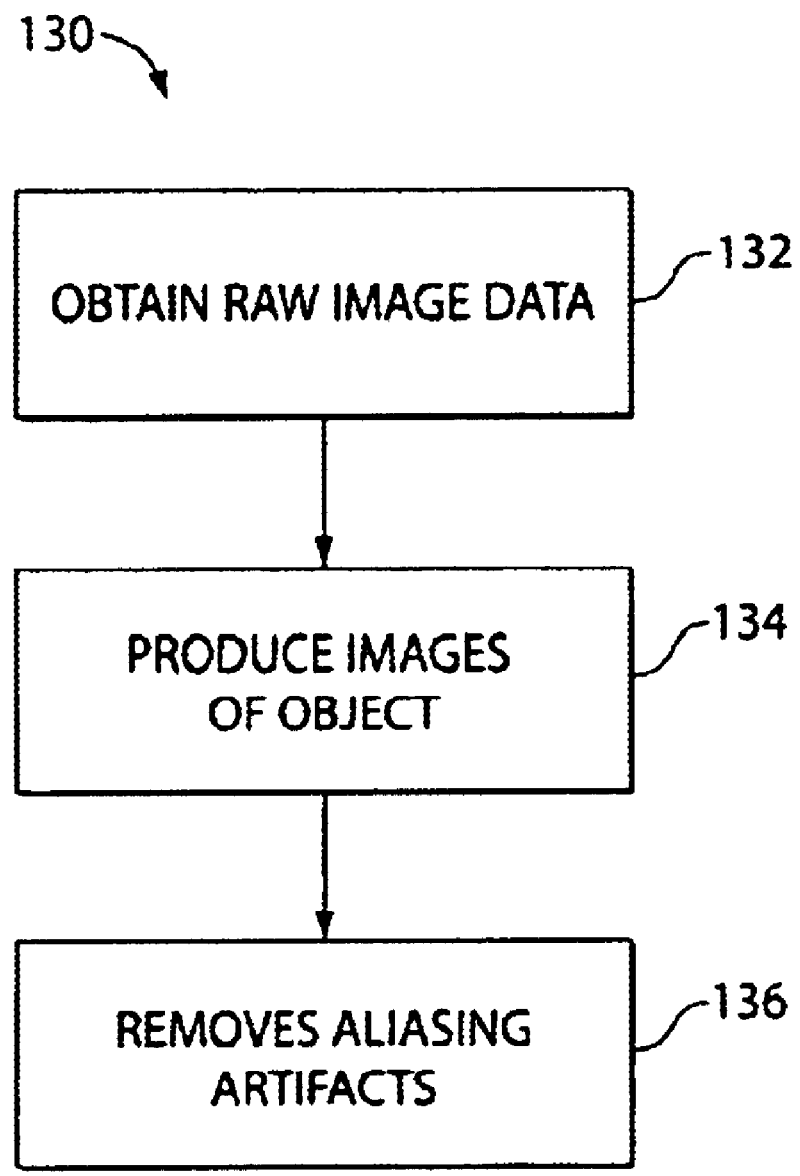
FIG. 6 is a block flow diagram of a process of imaging an object using the system shown in FIG. 5.

In operation, referring to FIG. 6, with further reference to FIGS. 4–5, a process 130 of imaging the object 114 using the system 120 includes the stages shown. The process 130, however, is exemplary only and not limiting. The process 130 can be altered, e.g., by having stages added, removed, or rearranged.

At stage 132, raw image data are obtained. The coils 112 measure data from the object 114, e.g., including the heart 116. These data are relayed through the cables 118 to the receiver boards 122 and on to the processor 124. The data are obtained by the coils 112 using a near-Cartesian sampling scheme, such as that shown in FIG. 3A.

At stage 134, the processor 124 produces an image of the object 114 from each one of the receiver coils, the image including aliasing effects. The processor 124 uses data from the coils near the center of k-space to self-calibrate the system 120 by determining the sensitivities of the coils 112.

At stage 136, using the images from the individual receiver-coils and the determined sensitivities, the processor 124 removes the aliasing artifacts from the image. The processor 124 uses parallel processing techniques and knowledge of the receiver-coil sensitivity to remove the aliasing artifacts and yield an image substantially free of the artifacts while using a relatively low amount of calculations.

Advantages of embodiments of the invention over previous methods also able to deal with non-Cartesian sampling schemes include one or more of simplicity, ease of implementation, not having to fit sensitivities to target functions as part of the reconstruction, fast processing speed and the avoidance of possible errors resulting from solving large systems of equations.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A variable-density parallel imaging method for reconstructing a magnetic resonance (MR) image, the method comprising:
    obtaining an MR k-space data set by sampling first and second sampling regions, wherein a first region is sampled with a first sampling density that is higher than a second sampling density of a second region;
    generating transformed MR images corrupted by aliasing artifacts by reconstructing the obtained MR data set; and
    combining the generated MR images with parallel imaging, using an acceleration rate of the second region.

2. The method of claim 1, wherein obtaining an MR data set includes acquiring the MR data set using a phased-array coil comprising a plurality of coil-elements, and wherein combining the generated MR images includes combining a plurality of images from a plurality of individual coil-elements into a resultant image.

3. The method of claim 2, wherein combining the plurality of images from the individual coil-elements includes inverting a number of matrices, the number of matrices being equal to a number of image pixels in the resultant MR image divided by the acceleration rate of the second region, wherein each matrix has a number of elements equal to or less than the number of coil-elements in the phased array coil times the acceleration rate of the second region.

4. The method of claim 2, wherein combining a plurality of images includes filling missing k-space locations with zeros.

5. The method of claim 4, wherein generating the transformed images comprises the application of a Fourier-transform after filling missing k-space locations with zeros.

6. The method of claim 5 wherein generating the transformed images further comprises correcting for the different first and second sampling densities.

7. The method of claim 1, wherein the first sampling region is substantially at a center of k-space.

8. The method of claim 1 wherein the first and second sampling densities both provide substantially regular sampling patterns.

9. The method of claim 8 wherein the first sampling density provides a first, Cartesian sampling pattern and the second sampling density provides a second sampling pattern comprising a Cartesian pattern perturbed by a substantially regular pattern.

10. The method of claim 1 wherein the sampling is performed in a near-Cartesian manner.

11. A variable-density parallel imaging method of magnetic resonance (MR) imaging for reconstructing an MR image, the method comprising:
   acquiring an MR k-space data set by using a phased-array coil consisting of a plurality of individual coil-elements and by sampling first and second sampling regions, wherein the first region is sampled with a higher sampling density than the second region;
   reconstructing a plurality of transformed images from a plurality of individual coil-elements; and
   combining the plurality of images from the individual coil-elements into a resultant MR image using parallel imaging.

12. The method of claim 11, wherein combining the plurality of images includes inverting a number of matrices, the number of matrices being equal to a number of image pixels in the resultant MR image divided by the accelerated rate of the second region, wherein each matrix has a number of elements equal to or less than the number of independent coil-elements of the phased array coil times an accelerated rate for the second region.

13. The method of claim 11, wherein combining the plurality of images includes inverting more than N matrices, each having less than NNM/n elements, wherein N is equal to a number of image pixels in one or more phase-encoded directions for a location in a frequency-encoded direction in the resultant MR image, M is equal to a number of individual coil-elements in the phased array coil and n is equal to an accelerated rate for the second region.

14. The method of claim 11, wherein reconstructing a plurality of transformed images from the individual coil-elements includes filling missing k-space locations with zeros and applying a Fourier-transform.

15. The method of claim 14, wherein the first sampling region is substantially at a center of k-space.

16. The method of claim 11, the first sampling region is substantially at a center of k-space.

17. An article of manufacture for implementing a variable-density parallel imaging technique, the article of manufacture comprising:
   a computer readable medium having computer readable program code for reconstructing a magnetic resonance (MR) image, the computer readable program code including instructions for causing a computer to:
   obtain an MR k-space data set from a phased-array coil consisting of a plurality of individual coil-elements and by sampling first and second sampling regions, wherein the first region is sampled with a higher sampling density than the second region;
   reconstruct a plurality of transformed images from a plurality of individual coil-elements; and
   combine the plurality of images from the individual coil-elements into a resultant MR image using parallel imaging.

18. The article of manufacture of claim 17, wherein the first sampling region is near a center of k-space.

19. The article of manufacture of claim 17, wherein the computer readable program code further comprises instructions for causing the computer to fill missing k-space locations with zeros before applying a Fourier-transform.

20. The article of manufacture of claim 17, wherein the computer readable program code comprises instructions for causing the computer to apply a Fourier-transform to reconstruct the transformed images.

21. An apparatus for implementing a variable-density parallel imaging technique for reconstructing a magnetic resonance (MR) image having a number of image pixels, wherein k-space MR data set is obtained by sampling first and second sampling regions, wherein a first region is sampled with a first sampling density that is higher than a second sampling density of a second region, the apparatus comprising:
   a phased array coil having a plurality of different coil-elements for obtaining the k-space MR data set; and
   a processor configured to generate transformed MR images corrupted by aliasing artifacts by reconstructing the obtained MR data sets and configured to combine the generated MR images with parallel imaging using an acceleration rate of the second region.

22. The apparatus of claim 21, wherein the processor reconstructs a plurality of images from a plurality of individual coil-elements, and wherein the processor combines the plurality of images from the individual coil-elements into a resultant image.

23. The apparatus of claim 21, wherein the processor inverts a number of matrices, the number of matrices being equal to a number of image pixels in the resultant MR image divided by the acceleration rate of the second region, wherein each matrix has a number of elements equal to or less than the number of coil-elements in the phased array coil times the acceleration rate of the second region.

24. The apparatus of claim 21, wherein the first sampling region is near a center of k-space.

25. The apparatus of claim 21, wherein the MR scanner fills missing k-space locations with zeros.

26. The apparatus of claim 21, wherein the processor is configured to apply a Fourier-transform after filling missing k-space locations with zeros.

* * * * *